US011410961B2

(12) United States Patent

Bayless et al.

(10) Patent No.: US 11,410,961 B2

(45) Date of Patent: Aug. 9, 2022

(54) METHODS AND APPARATUS FOR TEMPERATURE MODIFICATION IN BONDING STACKED MICROELECTRONIC COMPONENTS AND RELATED SUBSTRATES AND ASSEMBLIES

(71) Applicant: Micron Technology, Inc., Boise, ID (US)

(72) Inventors: Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 16/821,536

(22) Filed: Mar. 17, 2020

(65) Prior Publication Data

US 2021/0296192 A1 Sep. 23, 2021

(51) Int. Cl.

| | |
|---|---|
| ***H01L 23/00*** | (2006.01) |
| ***H01L 25/18*** | (2006.01) |
| ***H01L 25/065*** | (2006.01) |

(52) U.S. Cl.

CPC .............. *H01L 24/75* (2013.01); *H01L 24/81* (2013.01); *H01L 25/0657* (2013.01); *H01L 25/18* (2013.01); *H01L 2224/16221* (2013.01); *H01L 2224/16238* (2013.01); *H01L 2224/75263* (2013.01); *H01L 2224/81203* (2013.01); *H01L 2224/81224* (2013.01); *H01L 2225/06517* (2013.01)

(58) Field of Classification Search

CPC ........... H01L 24/75; H01L 2224/81203; H01L 2224/81224; H01L 2224/81237; H01L 2224/75252; H01L 2224/75263; H01L 2224/75301

See application file for complete search history.

(56) References Cited

U.S. PATENT DOCUMENTS

| | | | | |
|---|---|---|---|---|
| 6,384,366 | B1 * | 5/2002 | Wong | H01L 24/81 228/232 |
| 6,478,906 | B1 | 11/2002 | Azdasht et al. | |
| 7,803,661 | B2 | 9/2010 | Kim | |
| 8,552,567 | B2 | 10/2013 | England et al. | |
| 8,967,452 | B2 * | 3/2015 | Cheung | H01L 24/75 228/180.21 |
| 10,103,126 | B2 * | 10/2018 | Kira | H01L 25/074 |
| 10,497,691 | B2 * | 12/2019 | Shin | H01L 25/0657 |
| 10,971,471 | B2 * | 4/2021 | Bayless | H01L 24/83 |
| 10,978,420 | B2 * | 4/2021 | Hagiwara | H01L 21/52 |
| 2003/0224581 | A1 | 12/2003 | Lutz et al. | |
| 2007/0037318 | A1 | 2/2007 | Kim | |
| 2016/0049381 | A1 | 2/2016 | Ryu et al. | |

FOREIGN PATENT DOCUMENTS

| | | | |
|---|---|---|---|
| WO | 2015/072598 | A1 | 5/2015 |

* cited by examiner

*Primary Examiner* — David A Zarneke

(74) *Attorney, Agent, or Firm* — TraskBritt

(57) ABSTRACT

This patent application relates to methods and apparatus for temperature modification within a stack of microelectronic devices for mutual collective bonding of the microelectronic devices, and to related substrates and assemblies.

26 Claims, 9 Drawing Sheets

METHODS AND APPARATUS FOR TEMPERATURE MODIFICATION IN BONDING STACKED MICROELECTRONIC COMPONENTS AND RELATED SUBSTRATES AND ASSEMBLIES

TECHNICAL FIELD

Embodiments disclosed herein relate to bonding of stacked microelectronic devices. More particularly, embodiments disclosed herein relate to methods and apparatus for temperature modification within a stack of microelectronic devices for mutual collective bonding of the microelectronic devices, and to related substrates and assemblies.

BACKGROUND

Over time, lead frame-based microelectronic device packages have yielded major market share to microelectronic devices utilizing an array of conductive elements protruding from a surface thereof for connection to terminal pads of another target microelectronic device or other substrate. The transition has been stimulated, in large part, by increased circuit density, increasing numbers of pinouts, and smaller form factor requirements in terms of the "footprint" of microelectronic devices. Such a configuration is often referred to as a "flip chip" configuration, as the microelectronic device is inverted so that the surface bearing the protruding conductive elements faces downward toward the target. While the flip chip configuration was initially implemented using solder balls or bumps in a so-called C4 (controlled collapse chip connection) structure, more recently requirements for smaller conductive elements and tighter pitches (i.e., spacing between conductive elements) to accommodate the smaller form factors in combination with increased number of pinouts have stimulated the use of conductive metal (e.g., copper) pillars as conductive elements. In some instances, the pillars bear solder caps, generally isolated from the copper pillar material by a thin barrier (e.g., nickel) material. In either instance, bonding between conductive elements of a microelectronic device and terminal pads of another has conventional been effected by application of heat to the assembly in a reflow oven to melt the solder, or by application of heat in combination with applied force by a thermocompression bond head to melt the solder or absent solder, to implement diffusion bonds between the metal pillars and aligned terminal pads.

DETAILED DESCRIPTION

Figure 1A:
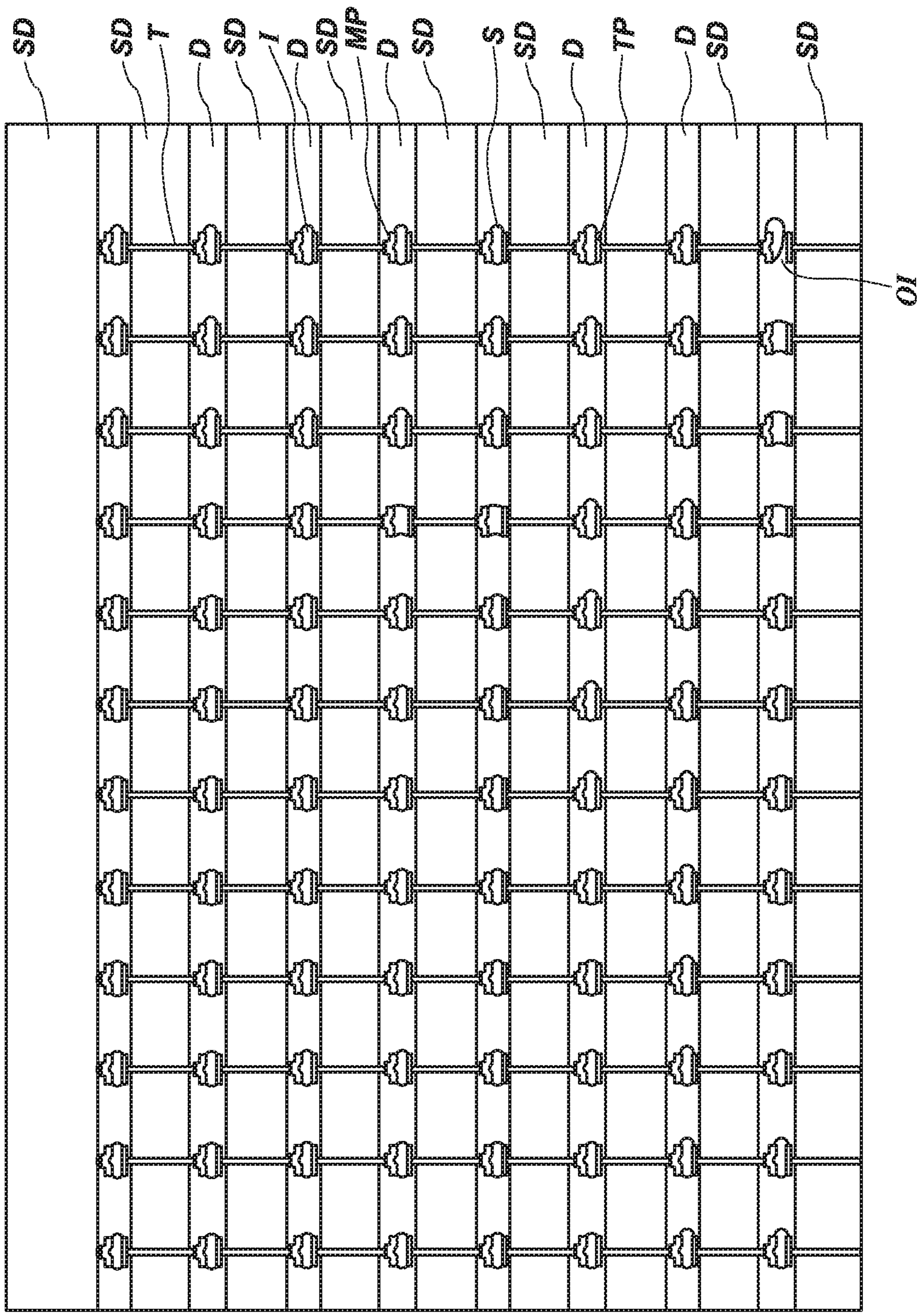
FIG. 1A is a schematic side partial cross-sectional view of a stack of microelectronic devices in the form of semiconductor dice and FIG. 1B is an enlargement of a portion of FIG. 1A showing an open interconnect.

Embodiments of the disclosure relate to methods and apparatus for controlling temperature, and more particularly temperature gradients, within a stack of microelectronic devices during mutual collective bonding of the microelectronic devices. Disclosed are bonding tools and energy beam generators for heating stacks of microelectronic devices from a both an uppermost and lowermost level of device stacks, as well as heat transfer structures on substrates supporting on the lowermost level microelectronic devices of the stacks, and methods of temperature control employing such bonding tools, substrates and devices. Electronic systems incorporating stacked microelectronic devices collectively bonded according to the disclosure are also described.

The following description provides specific details, such as sizes, shapes, material compositions, locations and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional process acts and apparatus employed in the industry, suitably modified in accordance with the disclosure. In addition, the description provided below may not form a complete process flow for mutually bonding stacked microelectronic devices, fabrication of microelectronic devices for incorporation in the stack, or further process acts for completing a microelectronic device package comprising a collectively bonded stack of microelectronic devices. Only those process acts and structures necessary to understand the embodiments of the disclosure are described in detail below.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another. In the description and for the sake of convenience, the same or similar reference numerals may be used to identify features and elements common between various drawing figures.

Mutual bonding of pillar-type conductive elements to terminal pads of another microelectronic device or substrate is conventionally effected by heat-induced mass reflow of the solder cap material, or by thermocompression bonding, wherein a bond head applies a Normal (i.e., vertical) downward force against a microelectronic device while heat is applied by the bond head. Both techniques may be suitable when only one, or a few, flip chip configured microelectronic devices are stacked and bonded. However, as the demand for increased circuit density continues, stacks of four, eight, twelve, sixteen or even more flip chip configured microelectronic devices require unacceptably increasing temperatures or dwell times in a mass reflow oven to effect bonding, straining the thermal budget of the microelectronic devices and increasing the potential for device failure. On the other hand, effective use of thermocompression bonding may be compromised by heat loss from the bond tip through the stack of microelectronic devices, as well as through the bond stage supporting the microelectronic device stacks and from sides of the assembly, resulting in difficulty in forming solder or diffusion bonds proximate the perimeter of the assembly. Heat loss issues are further exacerbated when thermocompression bonding is used for collective, or "gang" mutual bonding of greater numbers (e.g., four, eight, twelve, sixteen, etc.) of stacked microelectronic devices. In such instances, the relatively steep temperature gradient from the uppermost microelectronic device contacted by the bond tip of the bond head and the lowermost microelectronic device or substrate in the stack and from the center of the stack to the lateral periphery of the stack due to heat loss over the greater height of the assembly may result in lack of complete liquefaction of solder or failure to form a robust metal-to-metal diffusion bond. As a result, open interconnects may remain between the conductive elements and associated terminal pads adjacent the periphery of such an assembly. In addition, the heat loss and non-uniform heating of the stack may result in insufficient and/or non-uniform cure of the dielectric material, for example a non-conductive film (NCF) or wafer level underfill (WLUF) in the bond line between adjacent components in the stack, resulting in inconsistent bond line thickness, voids in the bond lines, or both. Further, while substrates bearing stacks of microelectronic devices may be thermocompression bonded using a bonding tool having a heated bond stage, bond stage temperature cannot be sufficiently high to compensate for heat loss through the stack of semiconductor devices without risking premature curing of the NCF or WLUF in lower bond lines in the stacks.

Figure 1B:
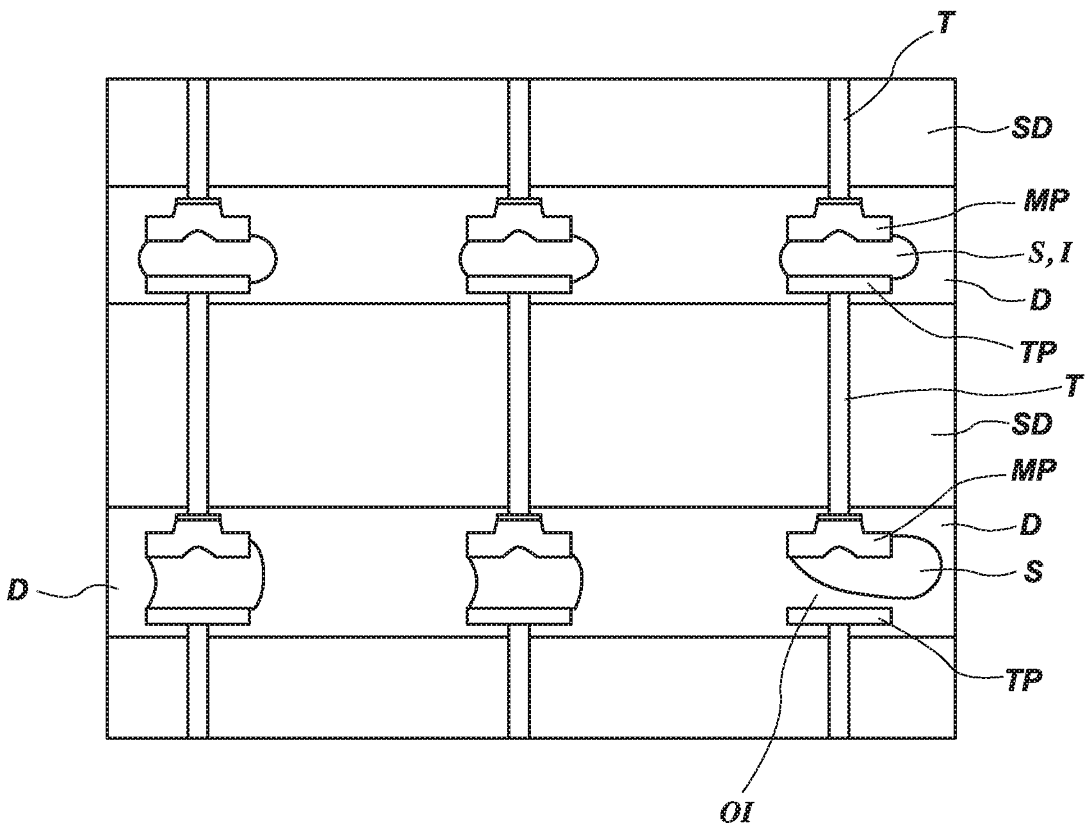

FIG. 1A shows a schematic side cross-section of an assembly of stacked and conventionally thermocompression-bonded microelectronic devices in the form of semiconductor dice SD, each die SD but for the uppermost die SD in the stack including through silicon vias (TSVs) T comprising conductive material isolated from the material of the semiconductor die, extending between major surfaces of the die, aligned with and respectively connected to conductive elements in the form of solder-capped metal pillars on one major surface and terminal pads on an opposing major surface. Ideally, after thermocompression bonding, the solder S capping each metal pillar MP has been melted and cooled in contact with a terminal pad TP to form a robust interconnect bond I, as shown in the majority of instances in FIG. 1A. However, as shown at the lower right-hand corner of FIG. 1A, heat loss and associated insufficient temperature margin across a lateral extent of lower microelectronic devices may result in an open interconnect OI, even when undesirably using a maximum tool (i.e., bond tip of bond head) temperature. FIG. 1B is an enlarged portion of FIG. 1A and depicts the open interconnect OI in more detail, showing the complete lack of contact of terminal pad TP by solder S on metal pillar MP. Dielectric material D surrounding interconnects I, for example a non-conductive film (NCF) or wafer level underfill (WLUF) is shown in the bond lines BL between adjacent components, the sections comprising FIGS. 1A and 1B having been taken through the assembly after encapsulation.

Figure 2:
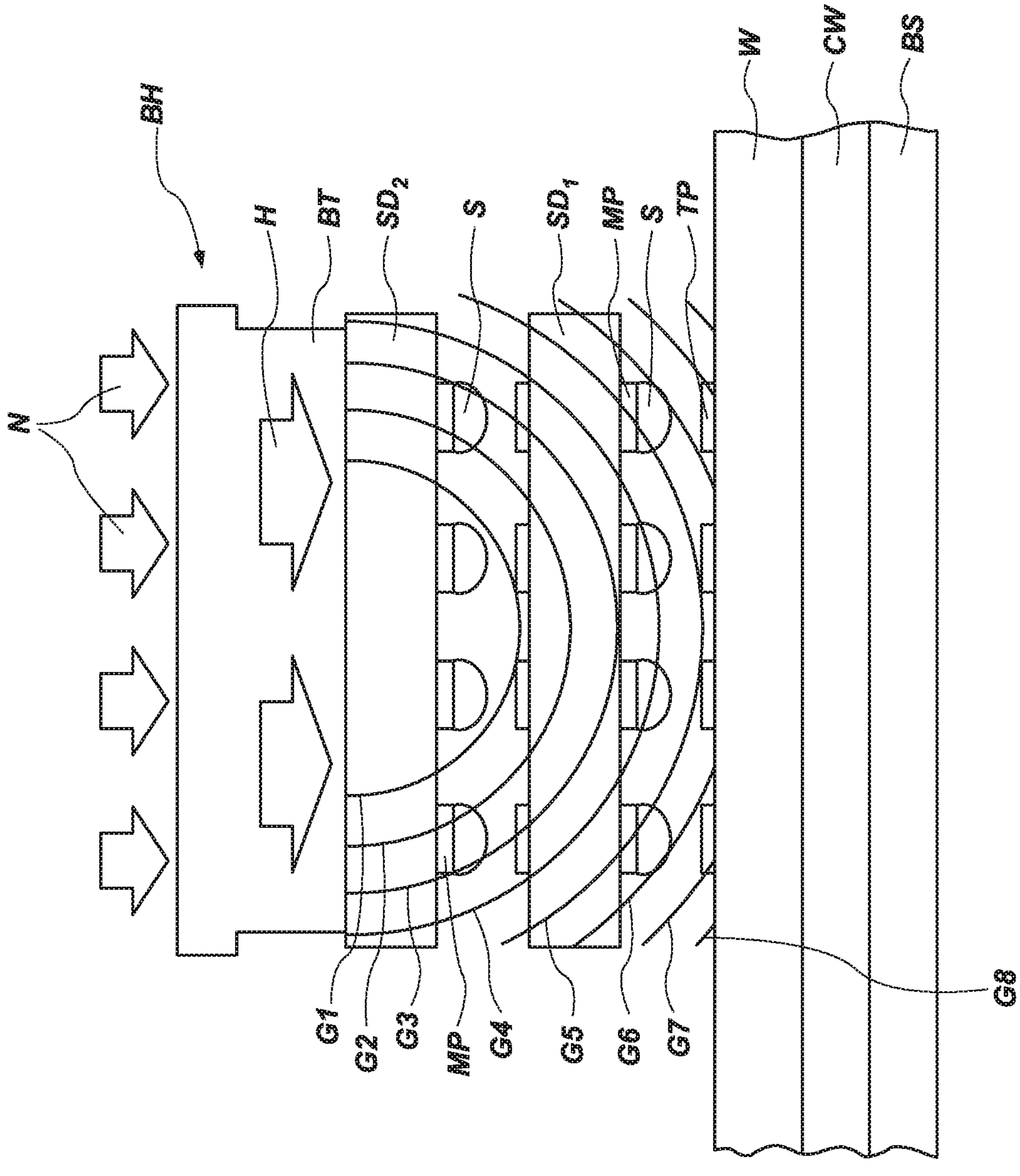
FIG. 2 is a schematic side partial cross-sectional view of a stack of semiconductor dice being thermocompression bonded by conventional techniques and graphically depicting a heat loss gradient from a bond tip of a bond head with greater distance downward and outward through the die stack.

FIG. 2 schematically depicts a heat gradient between a bond tip BT of thermocompression bond head BH and the bond stage BS of a thermocompression bonding tool during a thermocompression bonding operation wherein heat H and Normal force N are applied by bond head BH to a stack of microelectronic devices in the form of semiconductor dice $SD_1$ and $SD_2$ on a substrate, which may comprise a semiconductor wafer W supported on a carrier wafer CW on a bond stage BS of the thermocompression bonding tool. As can be readily seen and appreciated from the heat gradient lines G1 to G8, the farther heat travels longitudinally and laterally through the stack of semiconductor dice SD, the greater the heat loss and consequent likelihood that mutual bonding of conductive elements in the stack will not occur. As shown, undue heat loss may occur toward the perimeter of the lower semiconductor die $SD_1$ of the stack near wafer W in the area of heat gradient lines G7 and G8, preventing a robust interconnect between solder S, metal pillars MP and terminal pads TP at the periphery of lower semiconductor die $SD_1$. It is noted again that this heat loss phenomena is aggravated with increase in the number of microelectronic components, and thus stack height.

While bond tip temperatures of 400° C. or even 450° C. have been employed, such temperatures may, as recognized by the inventors herein, prove inadequate for thermocompression bonding of, for example, eight or more stacked microelectronic devices due to a lack of a sufficiently high temperature at the peripheries of lower devices in the stack. Further, the use of high temperatures, on the order of those mentioned above, may exceed the thermal budget of, and damage, certain microelectronic devices, for example dynamic random access memory (DRAM) semiconductor dice. In addition, application of excessive heat from a bond head may result in premature curing of NCF or WLUF in the bond lines, resulting in failure of the NCF or WLUF to maintain a minimum viscosity to spread during thermocompression bonding and provide a thin and uniform bond line. As, for example, conventional Sn/Ag solders have a melting point of about 221° C. or Sn solders having a melting point of about 231° C. and even Indium solders require about 170° C. to melt, it is apparent that heat loss through a microelectronic device stack rapidly becomes problematic with even only a 10° C. temperature decline per microelectronic device vertically through a stack, which decline is exacerbated by the presence of dielectric material such as NCF or WLUF in the bond lines, and a further distance heat applied by a bond tip may travel from a centerline of the stack to a periphery of the stack. Thus, for example in a stack of eight (8) DRAM semiconductor devices, heat loss from top to bottom of the stack may easily exceed 80° C. along a centerline of the stack, whereas heat loss to the sides and particular corners of the stack may be measurably greater.

Figure 3:
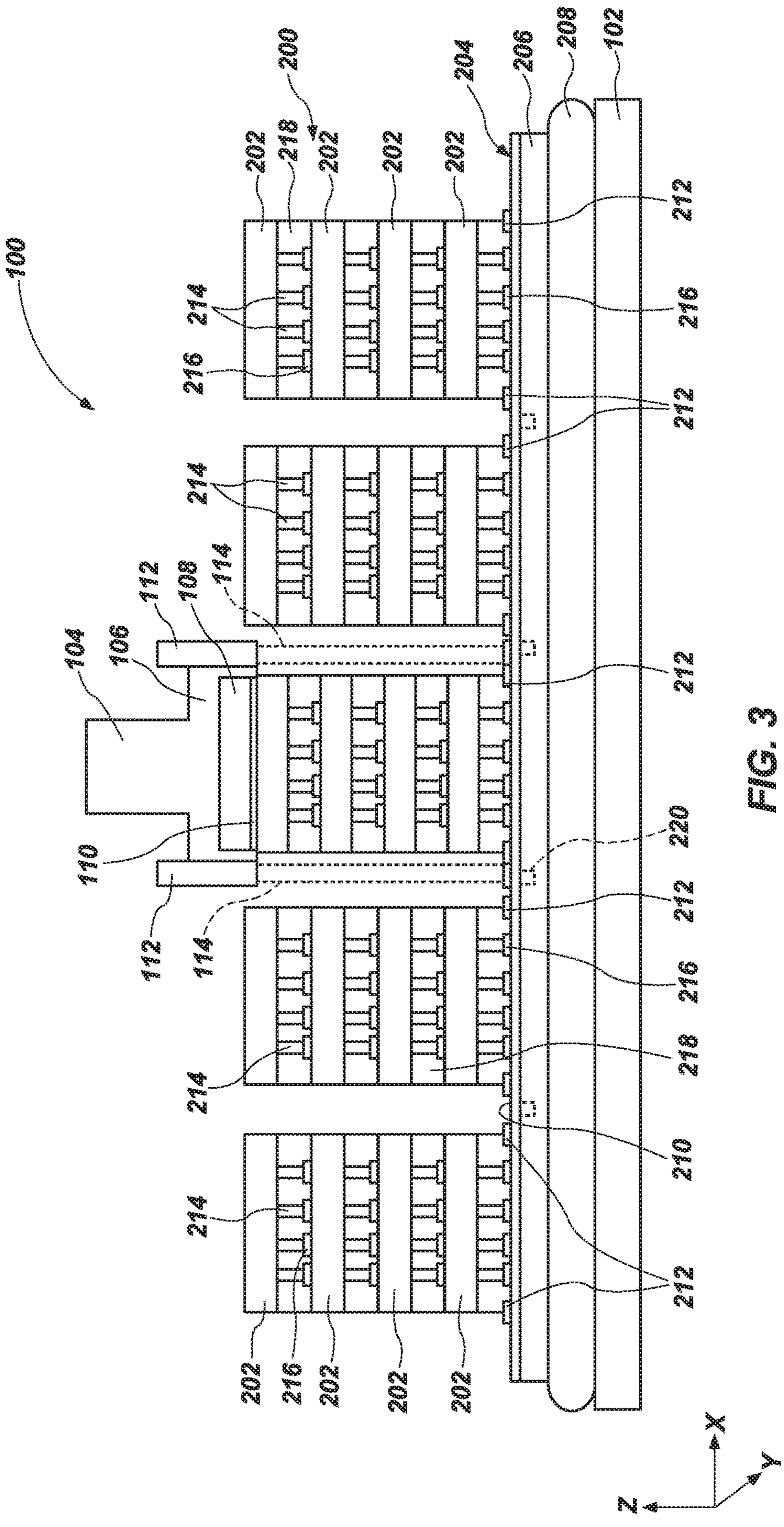
FIG. 3 is a schematic side partial cross-sectional view of a thermocompression bonding tool in the process of thermocompression bonding a stack of microelectronic devices on a substrate in accordance with an embodiment of the disclosure.
Figure 3A:
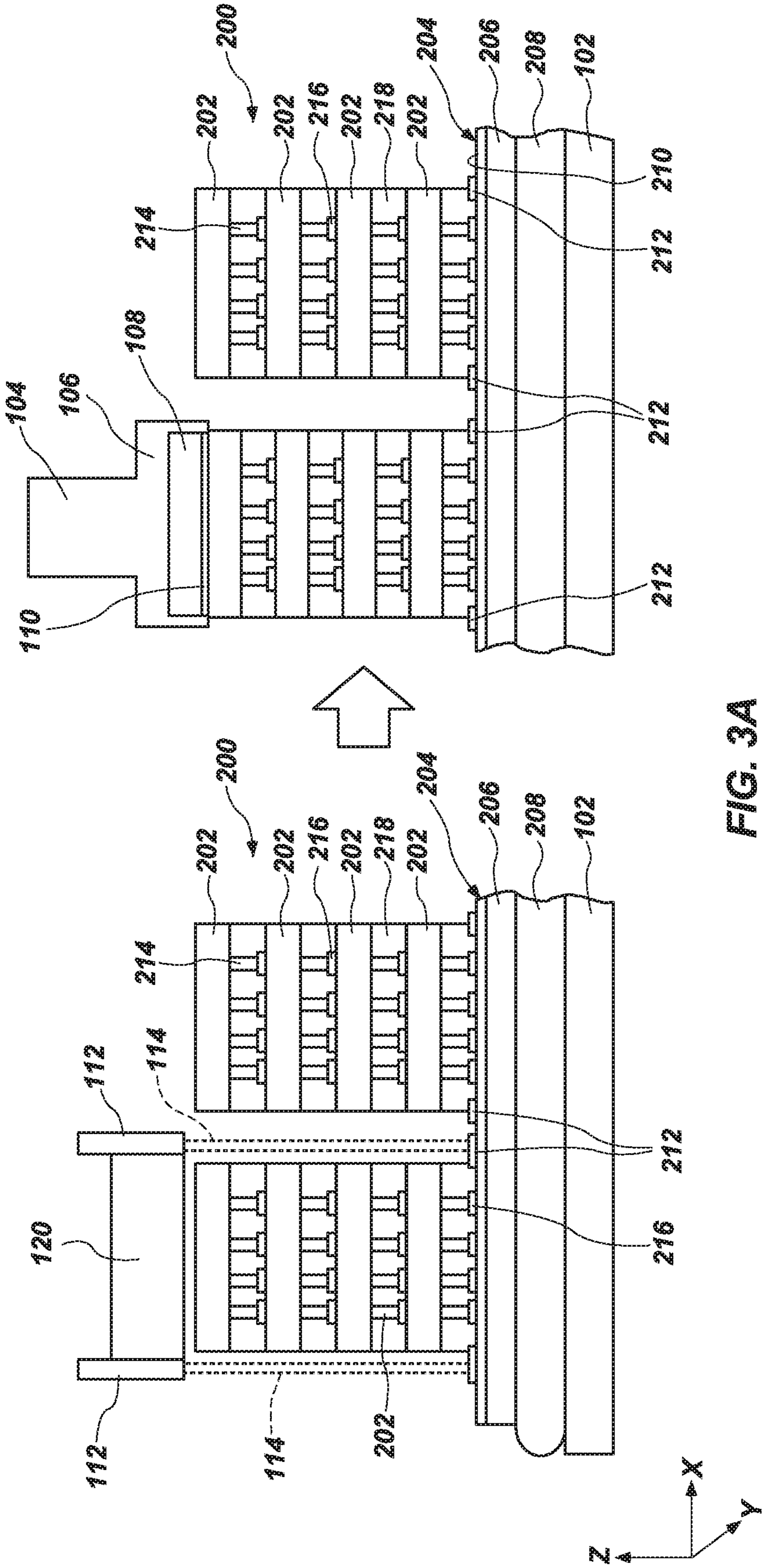
FIG. 3A is a schematic side partial cross-sectional view of a thermocompression bonding tool in the process of thermocompression bonding a stack of microelectronic devices on a substrate in accordance with another embodiment of the disclosure.

Referring now to FIG. 3 of the drawings, a thermocompression bonding tool 100 is depicted schematically. Multiple stacks 200 of microelectronic devices 202 (e.g., semiconductor devices) are located in mutually spaced relationship on a substrate 204 (e.g., semiconductor wafer) which may comprise an array of unsingulated microelectronic devices, an array of interposers, or other substrate. Substrate 204, which may comprise a thinned semiconductor wafer comprising an array of die locations, is adhered by adhesive 206 to a carrier substrate 208. Carrier substrate 208 is supported on a bond stage 102 (e.g., platform) of the thermocompression bonding tool 100. Bond head 104 of thermocompression bonding tool 100 is movable in the X, Y and Z directions, and includes a bond tip 106 comprising a heating device 108 adjacent to and in thermal communication with bond platen 110. Bond head 104 further comprises one or more energy beam (e.g., laser beam) generators 112 carried by the bond head 104 and oriented to transmit one or more energy beams 114 (e.g., laser beams) vertically downward between stacks 200 of microelectronic devices 202 to an upper surface 210 of substrate 204. Substrate 204, as described below in conjunction with FIGS. 4A and 4B of the drawings, may comprise one or more heat transfer structures 212 on the upper surface 210, the one or more heat transfer structures 212 each associated with a location of a stack 200 of microelectronic devices 202. In another implementation of the described embodiment illustrated schematically in FIG. 3A, the one or more energy beam generators 112 may be mounted to a movable beam head 120 separate from and independently movable with respect to bond head 104, which energy beam generators 112 may be employed to preheat one or more heat transfer structures 212 on a portion of an upper surface 210 of substrate 204 around and proximate a stack 200 of microelectronic devices and moved by bond stage 102 to a position under bond head 104 just before bond tip 106 of thermocompression bond head 104 contacts the top of the stack 200, so that heat transfer structures 212 are heated prior to contact of the stack 200 with thermocompression bond head 104. Further, energy beam generators may emit energy beams 114 to heat transfer structures during all or at least part of the time thermocompression bond head 104 applies heat and pressure to stack 200. Of course, beam head 120 and bond head 104 may be movable in the X, Y and Z directions and bond stage 102 may be stationary. In the case of either embodiment, the energy beam generators 112 are positionable to selectively direct energy beams 114 toward an upper surface of the bond stage 102. With either arrangement and placement of energy beam generators 112, conductive elements 214 protruding from microelectronic devices 202 and, optionally solder caps (not shown) on conductive elements as previously described, may be heated and bonded to terminal pads 216 of adjacent microelectronic devices 202 or substrate 204 and dielectric material 218 (e.g., NCF or WLUF) in bond lines between components cured.

Figure 4A:
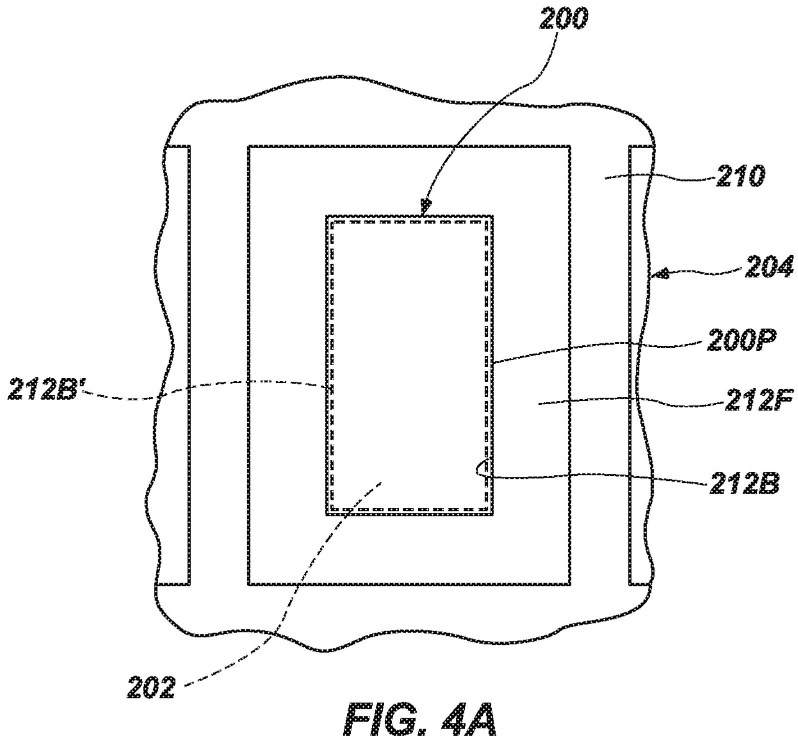
FIGS. 4A and 4B are schematic top elevations of stacks of microelectronic devices located on a substrate for thermocompression bonding according to embodiments of the disclosure.
Figure 4B:
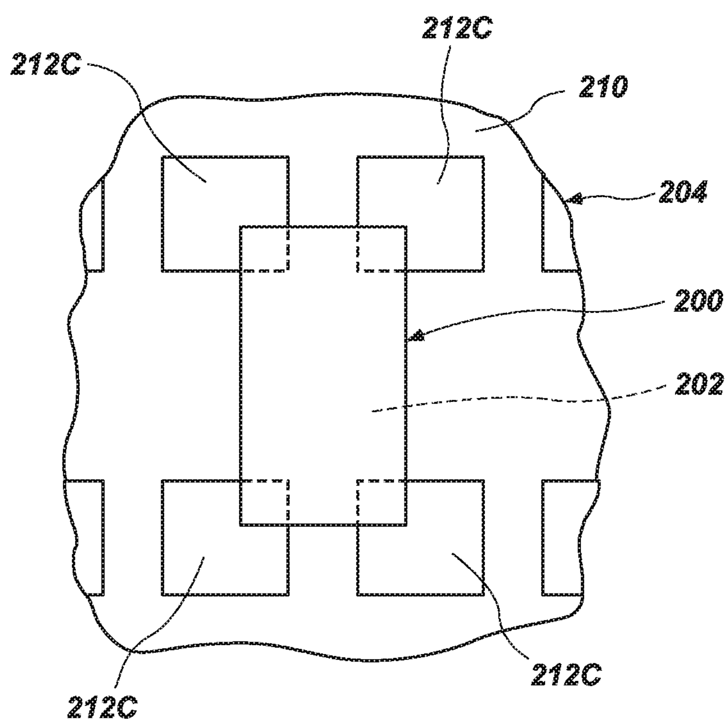

FIGS. 4A and 4B depict, respectively, top schematic elevations of different implementations of heat transfer structures 212 on a portion of upper surface 210 of substrate 204 having a stack 200 of microelectronic devices 202 thereon. FIG. 4A depicts an implementation wherein a peripheral frame heat transfer structure 212F is located immediately adjacent to a periphery microelectronic device stack 200, with an inner boundary 212B' of heat transfer structure 212F substantially coincident with a lateral periphery 200P of microelectronic device stack 200. As shown in broken lines, inner boundary 212B' may, optionally, lie within the lateral periphery 200P, which may also be characterized as the "footprint," of microelectronic device stack 200 yet laterally outward of and electrically isolated from, an array of conductive elements (not shown) of lowermost microelectronic device 202. In the case of a peripheral frame heat transfer structure 212F, two or more, for example four, energy beams 114 may be aimed at midpoints of each side of the frame. As another approach, the energy beam generators 112 may be configured to scan energy beams 114 linearly back and forth along each side of the frame on substrate 204, and thus toward bond stage 102. FIG. 4B depicts an implementation wherein four (4) heat transfer structures 212C are located adjacent to and extend under corners of the microelectronic device stack 200. As shown in broken lines, inner corners of each of the heat transfer structures 212C may extend under the footprint of microelectronic device stack 200. When employing heat transfer structures 212C, an energy beam 114 may be aimed at each heat transfer structure 212C or a single energy beam may be scanned and pulsed alternatively between different heat transfer structures 212C.

Substrate 204 may comprise, for example, a wafer having an array of mutually spaced microelectronic device locations thereon (e.g., a semiconductor wafer having semiconductor die locations), an interposer comprising conductive traces and optionally, passive and/or active circuitry, a panel or wafer of Fan Out Package (FOP)-configured redistribution layers (RDLs). Broadly, embodiments of the disclosure are generally applicable to chip-to-chip and chip-to-wafer bonding.

If, for example, substrate 204 comprises a semiconductor wafer including active circuitry at die locations thereon, the heat transfer structures 212 may be fabricated in the form of segments of metal material by electroplating on the surface of the substrate 204 simultaneously with electroplating of an array of terminal pads (e.g., Ni/Au) on the surface electrically isolated from the terminal pads and using a single, common mask. However, if desirable, heat transfer structures may be separately fabricated using a different mask and, optionally, a different metal material.

Figure 5:
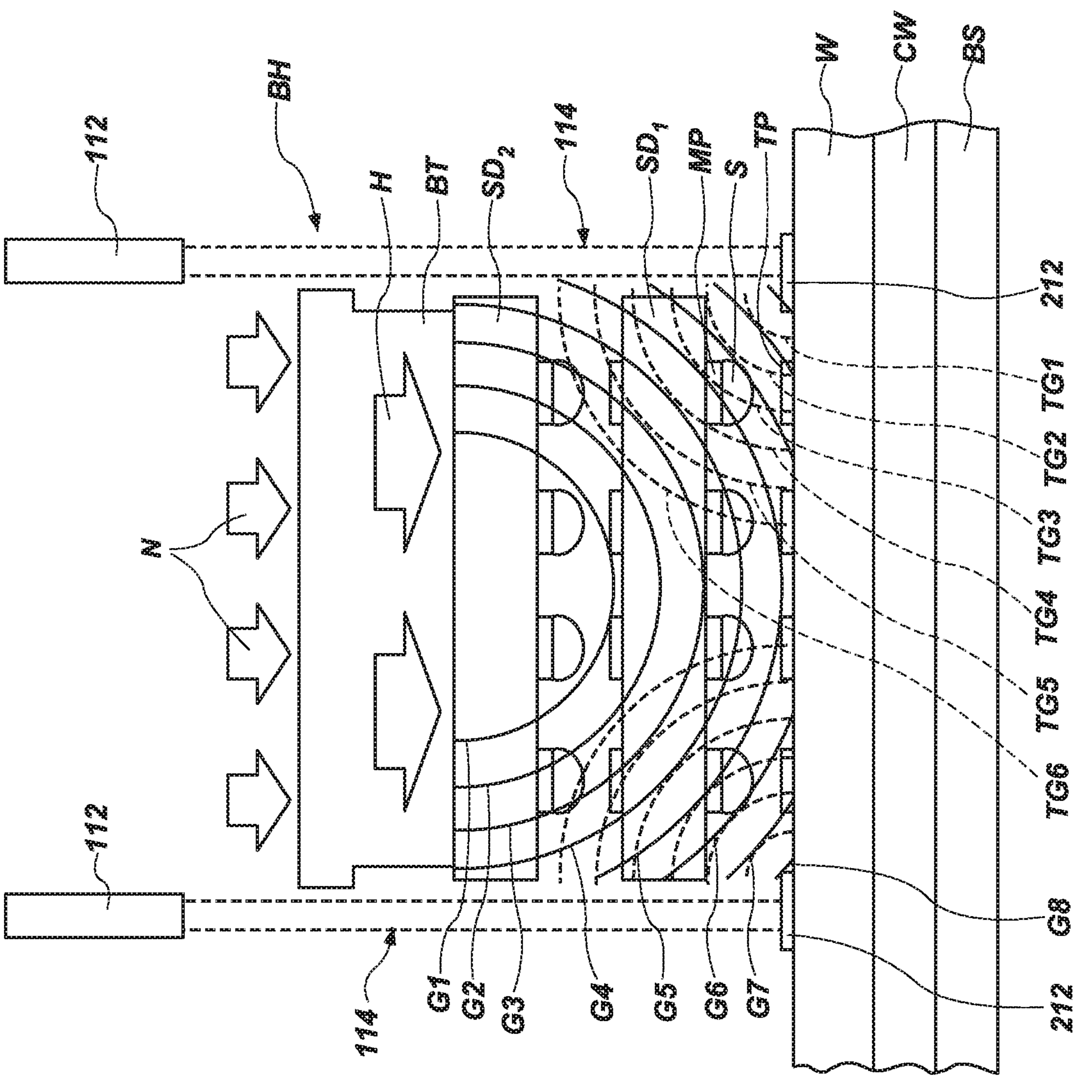
FIG. 5 is a schematic side partial cross-section view of a stack of semiconductor dice being thermocompression bonded according to embodiments of the disclosure, and graphically depicting a heat loss gradient from a bond tip of a bond head with greater distance downward and outward through the die stack and offsetting heat gain into the stack from application of heat to heat transfer structures on a substrate supporting the stack.

In each implementation, the heat transfer structure comprises one or more target areas on surfaces thereof for impingement of energy beams 114 and a heat transfer path for heat absorbed from energy beams 114 to a location adjacent to or under a microelectronic device stack 200 and electrically isolated from circuitry of the microelectronic device stack and of the substrate. It will be appreciated that the use of heat transfer structures 212 in conjunction with energy beam generators 112 emitting energy beams 114 absorbed by heat transfer structures 212 will absorb a substantial amount of heat from energy beams 114 and prevent undue penetration and heating of substrate 204 while transferring heat to the microelectronic device stack 200 from the bottom microelectronic device 202 upwardly, producing an upwardly extending temperature gradient to at least partially offset heat loss in the stack 200 in the downwardly extending temperature gradient associated with heating of the uppermost microelectronic device 202 in the stack 200 by heating device 108 of bond tip 106. Such a phenomenon is illustrated graphically in FIG. 5, which includes the heat gradients G1-G8 of FIG. 2 as well as heat transfer gradients TG1-TG6 as shown in broken lines extending inwardly and upwardly from the periphery of the die stack. Referring back to FIG. 3, if desirable substrate 204 may be grooved as shown at 220 to limit heat exchange between adjacent portions and thus limit the potential for heat-induced damage to active circuitry of a wafer portion adjacent a portion being heated. Of course, it may be desirable to completely sever wafer portions along streets between the wafer portions to further limit heat transfer. In addition, a reconstituted wafer with previously singulated wafer portions (e.g., microelectronic devices, semiconductor dice) reassembled in a mutually spaced, fixed array and, for example, separated by dielectric material may be employed as substrate 204.

It is contemplated that heat transfer structures 212 may remain on the singulated substrate portions bearing each stack of microelectronic devices after singulation or be removed. In the first instance, if the heat transfer structures are located outside of streets between substrate portions to be singulated, they will not be removed by a dicing blade or laser. Further, if heat transfer structures extend under a lowermost microelectronic device of a stack, they will remain after singulation. If, however, the heat transfer structure are positioned to extend within or across the streets, they will be removed during singulation, for example by a dicing blade or laser. It is noted that, if the heat transfer structures are located outside of the streets, they may be recessed from the street boundaries so as to not extend to an outer surface of a dielectric material (e.g., an epoxy molding compound (EMC)) used to encapsulate at least the sides of the stacks, to avoid shorting and electrostatic discharge (ESD) issues.

It may be desirable to employ energy beam generators 112 in the form of laser beam generators configured to emit laser beams, the amount of energy in the laser beams being controllable by selection of power and pulse rate for the beams. In some instances, it may be desirable to generate laser beams having a relatively short wavelength in the ultraviolet range, for example in the range of about 180 nm to about 400 nm, enabling the use of relatively thin metal for the heat transfer structures without risk of damage to circuitry of the substrate 204. Such a wavelength selection may minimize diffraction, resulting in little beam divergence. Of course, laser beams of other wavelength ranges may be employed. It is also contemplated that energy beams other than laser beams, for example electron beams or ion beams in an appropriate environment, may be employed to impinge on, and heat, heat transfer structures according to the disclosure.

Figure 6:
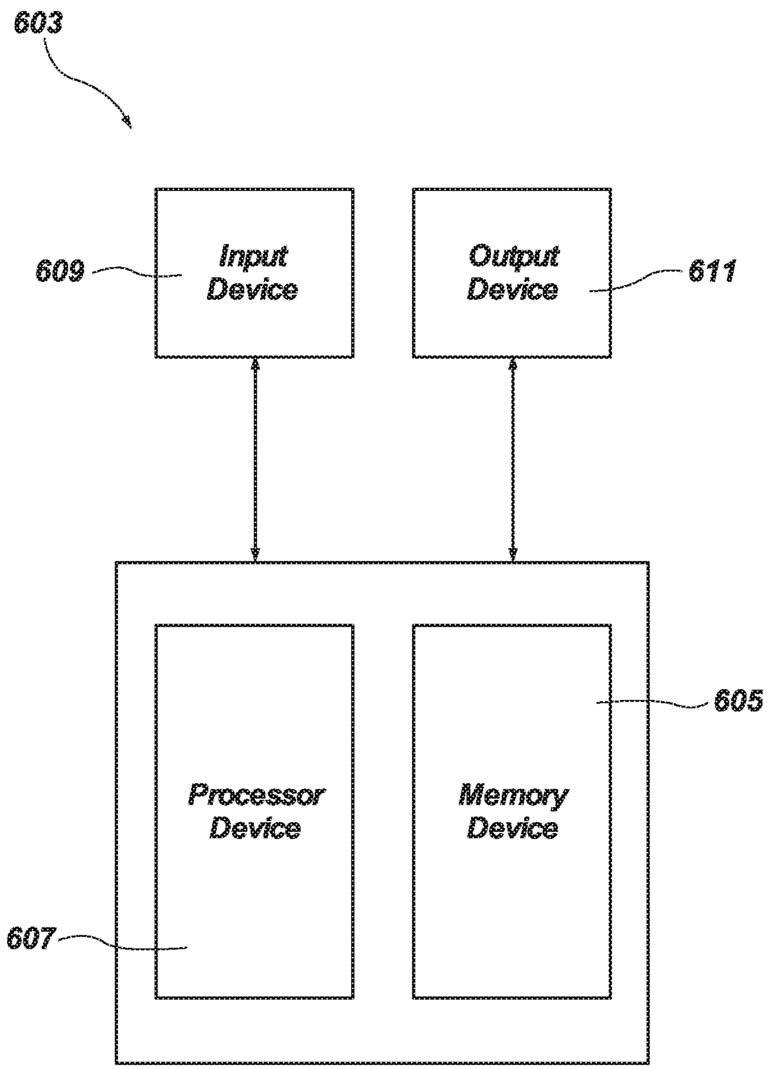
FIG. 6 is a block diagram of an electronic system incorporating an assembly comprising a stack of microelectronic devices thermocompression bonded according to embodiments of the disclosure.

Microelectronic device stacks incorporating heat transfer structures and fabricated according to embodiments of the disclosure may be used in electronic systems. For example, FIG. 6 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, an automotive infotainment system, a vehicle engine control system, a self-driving vehicle control system, etc. The electronic system 603 includes at least one memory device 605. The at least one memory device 605 may comprise, for example, a stack of memory dice incorporating heat transfer structures and collectively thermocompression bonded according to embodiments of the disclosure. Further, the at least one memory device 605 may be stacked with at least one other device, for example an electronic signal processor 607 as hereinafter referenced.

The electronic system 603 may further include at least one electronic signal processor device 607 (often referred to as a "microprocessor"). The electronic signal processor device 607 may include metal pillar structures according to embodiments of the disclosure. The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607. At least some of the foregoing devices may be stacked and collectively thermocompression bonded according to embodiments of the disclosure into an assembly and mounted to one or more substrates, for example an interposer, a motherboard or other circuit board.

Figure 7:
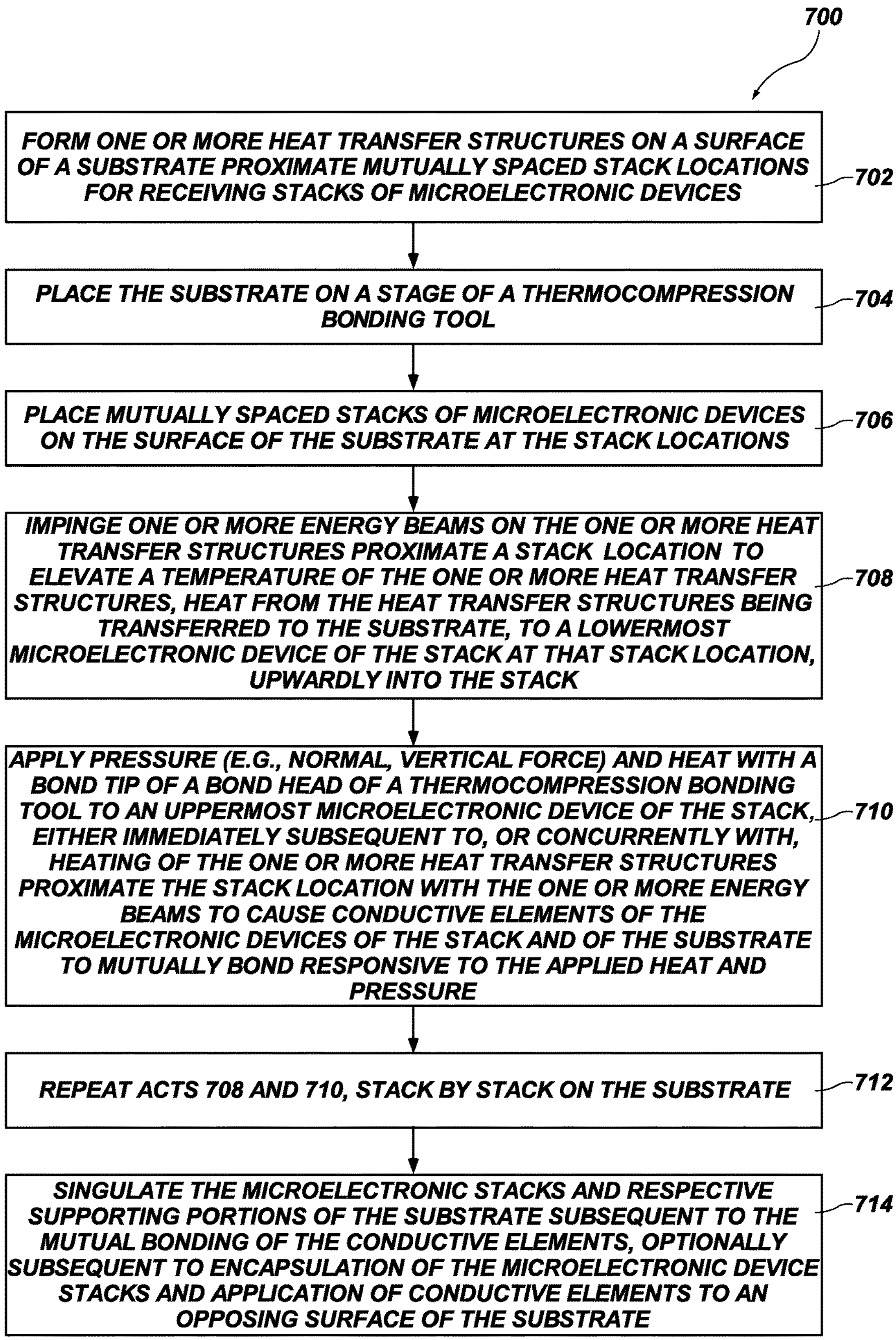
FIG. 7 is a block diagram of a process for fabricating thermocompression bonded microelectronic device assemblies and, optionally, packages comprising such assemblies.

As depicted in the flow diagram of FIG. 7, in their broadest sense, embodiments of the disclosure may be implemented by a method 700 comprising an act 702 of forming one or more heat transfer structures proximate mutually spaced stack locations on a surface of a substrate for receiving stacks of microelectronic devices. In act 704, the substrate is placed on a stage of a thermocompression bonding tool. In act 706, mutually spaced stacks of microelectronic devices are placed on the surface of the substrate at the stack locations. In act 708, one or more energy beams are impinged on the one or more heat transfer structures proximate a stack location to elevate a temperature of the one or more heat transfer structures, heat from the heat transfer structures being transferred to the substrate, to a lowermost microelectronic device of the stack at that stack location and upwardly into the stack. In act 710, a bond head of a thermocompression bonding tool applies pressure (e.g., Normal, vertical) force and heat to an uppermost microelectronic device of the stack with a bond tip, either immediately subsequent to, or concurrently with, heating of the one or more heat transfer structures at the stack location with the one or more energy beams, to cause conductive elements of the microelectronic devices of the stack and of the substrate to be mutually bonded responsive to the applied heat and pressure. In act 712, acts 708 and 710 are repeated, stack by stack on the substrate. In act 714, subsequent to mutual bonding of the conductive elements of the microelectronic devices of the stacks on the substrate, the microelectronic device stacks and respective supporting portion of the substrate comprising the stack locations may be singulated, optionally subsequent to encapsulation of the stacks with an EMC and application of conductive elements to an opposite surface of the substrate for connection of the assembly to higher level packaging. The end result, in certain embodiments, is a stack of microelectronic devices in the form of semiconductor dice on a singulated substrate segment also comprising a semiconductor die. The semiconductor dice of the assembly may all comprise memory dice, or a logic or other controller die may be incorporated in the stack. In some embodiments, a general purpose microprocessor die, a graphics processing unit (GPU) die or an application specific integrated circuit (ASIC) die may be stacked with memory dice.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example, substrates having multiple metal layers in the form of traces and is interposed with dielectric layers (e.g., resin-glass weave polymers). For example, conventional BGA packages include multiple die and encapsulation (e.g., epoxy molding compound (EMC)) on one side of an organize substrate and an array of solder balls on the other side.

As used herein, the term "microelectronic device" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrate segments including more than one die location.

As used herein, the terms "metal" and "metal material" mean and include, unless otherwise expressly stated, elemental metals, metal alloys and combinations (e.g., layers) of different and adjacent metals or metal alloys.

CONCLUSION

Embodiments of the disclosure comprise a thermocompression bonding tool comprising: a bond stage configured for supporting a substrate on an upper surface thereof; a movable bond head configured for applying pressure to stacked microelectronic component through a bond tip including a heating device and one or more energy beam generators positionable to selectively direct energy beams toward an upper surface of the bond stage.

Embodiments of the disclosure comprise a method of thermocompression bonding, comprising placing a substrate bearing mutually laterally spaced stacks of microelectronic devices on a bond stage of a thermocompression bonding tool, heating an upper surface of the substrate adjacent to a stack of microelectronic devices with one or more energy beams and immediately subsequent to, or concurrently with, the heating the substrate, applying heat and pressure to the stack of microelectronic devices with a bond head of the thermocompression bonding tool.

Embodiments of the disclosure comprise a substrate comprising mutually laterally spaced locations, each respective location including an array of terminal pads on a substrate surface for connection to conductive elements of a stack of microelectronic devices to be placed on the respective location, and one or more heat transfer structures on the substrate surface at least proximate each respective location and electrically isolated from the array of terminal pads thereof.

Embodiments of the disclosure comprise a microelectronic device assembly comprising a stack of microelectronic devices on a substrate segment extending laterally beyond sides of the stack of microelectronic devices, a dielectric encapsulant material at least extending over side of the stack of microelectronic devices and contacting a surface of the substrate segment bearing one or more metal heat transfer structures at least adjacent to one or more sides of the stack of microelectronic devices and electrically isolated from circuits of the microelectronic devices of the stack and of the substrate, and conductive elements protruding from a surface of the substrate opposite the stack of microelectronic devices.

Embodiments of the disclosure comprise an electronic system comprising one or more input devices, one or more output devices, at least one microprocessor device and at least one memory device, wherein at least one of the at least one microprocessor device and the at least one memory device, or a physical combination thereof, comprises a stack of microelectronic devices on a substrate segment having on a surface thereof facing the stack of microelectronic devices, one or more metal heat transfer structures adjacent to the stack and electrically isolated from circuitry of the stack of microelectronic devices and of the substrate segment.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A thermocompression bonding tool, comprising:

a bond stage configured for supporting a substrate bearing at least one stack of microelectronic components;

a movable bond head configured for applying pressure to the at least one stack of microelectronic components through a bond tip including a heating device; and one or more energy beam generators oriented to selectively direct energy beams toward the bond stage at one or more locations on the substrate proximate and outside of a periphery of the at least one stack of microelectronic components on the substrate.

2. The thermocompression bonding tool of claim 1, wherein the one or more energy beam generators are carried by the bond head and oriented to selectively direct the energy beams vertically toward the bond stage.

3. The thermocompression bonding tool of claim 1, wherein the one or more energy beam generators are carried by a beam head movable independently from the bond head, the one or more energy beam generators oriented to selectively direct the energy beams vertically toward the bond stage.

4. The thermocompression bonding tool of claim 1, wherein the one or more energy beam generators are each configured to direct an energy beam in the form of a laser beam, an ion beam or an electron beam.

5. The thermocompression bonding tool of claim 1, wherein the one or more energy beam generators are each configured to selectively direct a laser beam having a wavelength range from about 180 nm to about 400 nm.

6. The thermocompression bonding tool of claim 1, wherein at least one of the one or more energy beam generators is configured to scan the selectively directed energy beam linearly over a portion of the substrate under the one or more energy beam generators and adjacent the at least one stack of microelectronic components.

7. A method of thermocompression bonding, comprising:

providing a substrate bearing mutually laterally spaced stacks of microelectronic components on a bond stage of a thermocompression bonding tool;

heating the substrate adjacent to and outside a periphery of a stack of microelectronic components with one or more energy beams directed toward the bond stage from one or more energy beam generators; and immediately subsequent to, or concurrently with, the heating the substrate, applying heat and pressure to the stack of microelectronic components with a heating device of a bond tip of a movable bond head of the thermocompression bonding tool over and aligned with the stack of microelectronic components.

8. The method of claim 7, wherein providing a substrate bearing mutually laterally spaced stacks of microelectronic components further comprises providing the substrate with one or more heat transfer structures on a surface thereof at least proximate and including at least a portion outside a periphery of a location of each of the mutually laterally spaced stacks of microelectronic components and heating the substrate comprises impinging one or more energy beams on the one or more heat transfer structures at least proximate and outside a the periphery of the stack of microelectronic components.

9. The method of claim 8, wherein providing the substrate with one or more heat transfer structures at least proximate a location of each of the stacks of microelectronic components further comprises providing the substrate with one or more metal heat transfer structures, at least one of the one or more metal heat transfer structures including a portion proximate and outside the periphery of a location of each stack of microelectronic components and another portion extending under a footprint of the stack.

10. The method of claim 8, wherein impinging the one or more energy beams on the one or more heat transfer structures further comprises impinging laser beams, ion beams or electron beams on the one or more heat transfer structures at least proximate and outside of the periphery of the stack of microelectronic components.

11. The method of claim 8, further comprising scanning at least one of the one or more energy beams over a surface of at least one of the one or more heat transfer structures at least proximate and outside the periphery of the stack of microelectronic components.

12. The method of claim 8, further comprising aiming the one or more energy beams vertically between the stack of microelectronic components and one or more adjacent stacks of microelectronic components to impinge on the heat transfer structures.

13. The method of claim 8, further comprising impinging the one or more energy beams on the heat transfer structures of a stack of microelectronic components independently of and prior to applying heat and pressure to the stack of microelectronic components with the bond tip of the bond head.

14. The method of claim 8, further comprising impinging the one or more energy beams on the heat transfer structures of the stack of microelectronic components at least in part within a period during which heat and pressure are applied to the stack of microelectronic components with the bond tip of the bond head.

15. The method of claim 8, further comprising providing the substrate in the form of a semiconductor wafer comprising microelectronic component locations at the locations of the stacks of microelectronic components.

16. The method of claim 15, further comprising providing the microelectronic components and the microelectronic component locations in the form of, respectively, semiconductor dice and semiconductor dice locations.

17. The method of claim 16, further comprising providing at least some of the semiconductor dice in each stack in the form of memory dice.

18. The method of claim 8, further comprising encapsulating the stacks of microelectronic components on the substrate with a dielectric material and singulating the stacks of microelectronic components through the dielectric material and the substrate along streets between the stacks of microelectronic components.

19. The method of claim 18, wherein providing the substrate with one or more heat transfer structures at least proximate and including at least a portion outside of a periphery of a location of each of the stacks of microelectronic components further comprises providing at least some of the one or more heat transfer structures to extend into or across the streets, and singulating the stack of microelectronic components further comprises removing material of the heat transfer structures extending into or across the streets.

20. A thermocompression bonding tool, comprising:

a bond stage for supporting a substrate bearing mutually laterally spaced stacks of microelectronic devices;

a movable bond head having a bond tip and a heating device for applying pressure and heat to a stack of microelectronic devices; and multiple energy beam generators oriented to selectively direct energy beams toward the bond stage at multiple locations proximate and outside of a periphery of each mutually laterally spaced stack of microelectronic devices on the substrate.

21. The thermocompression bonding tool of claim 20, wherein the multiple energy beam generators are carried peripherally by the bond head and oriented to selectively direct the energy beams vertically toward the bond stage.

22. The thermocompression bonding tool of claim 20, wherein the multiple energy beam generators are carried by a beam head movable independently from the bond head, the multiple energy beam generators oriented to selectively direct the energy beams vertically toward the bond stage.

23. The thermocompression bonding tool of claim 20, wherein multiple energy beam generators are each configured to generate an energy beam in the form of a laser beam, an ion beam or an electron beam.

24. The thermocompression bonding tool of claim 20, wherein the multiple energy beam generators are each configured to generate a laser beam having a wavelength range from about 180 nm to about 400 nm.

25. The thermocompression bonding tool of claim 20, wherein at least one of the multiple energy beam generators is configured to scan the selectively directed energy beam linearly over a portion of the substrate adjacent to a side of a stack of microelectronic devices on the substrate.

26. The thermocompression bonding tool of claim 25, wherein the multiple energy beam generators comprise four energy beam generators, each energy beam generator configured to scan a respective selectively directed energy beam linearly over a portion of the substrate adjacent to a side of a stack of microelectronic devices on the substrate.

* * * * *